(12) United States Patent
Melanson et al.

(10) Patent No.: US 7,183,954 B1
(45) Date of Patent: Feb. 27, 2007

(54) CIRCUITS, SYSTEMS AND METHODS FOR VOLUME CONTROL IN LOW NOISE 1-BIT DIGITAL AUDIO SYSTEMS

(75) Inventors: John Laurence Melanson, Austin, TX (US); Jason Powell Rhode, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/818,240

(22) Filed: Apr. 5, 2004

Related U.S. Application Data (63) Continuation of application No. 10/269,582, filed on Oct. 11, 2002, now Pat. No. 6,803,869, which is a continuation-in-part of application No. 09/905,475, filed on Jul. 13, 2001, now abandoned.

(51) Int. Cl.
   *H03M 3/00* (2006.01)
(52) U.S. Cl. ..................... 341/143; 341/144
(58) Field of Classification Search .......... 341/143, 341/144, 142, 147, 200
   See application file for complete search history.

(56) References Cited

U.S. PATENT DOCUMENTS

| 5,774,567 | A | * | 6/1998 | Heyl | 381/119 |
|---|---|---|---|---|---|
| 5,877,716 | A | * | 3/1999 | Tagami | 341/143 |
| 6,011,501 | A | * | 1/2000 | Gong et al. | 341/150 |
| 6,031,475 | A | * | 2/2000 | Combe et al. | 341/143 |
| 6,064,700 | A | | 5/2000 | Noguchi et al. | |
| 6,147,522 | A | * | 11/2000 | Rhode et al. | 327/93 |
| 6,255,975 | B1 | * | 7/2001 | Swanson | 341/143 |
| 6,373,954 | B1 | * | 4/2002 | Malcolm et al. | 381/119 |
| 6,426,934 | B1 | * | 7/2002 | Inayama | 369/124.01 |
| 6,489,909 | B2 | | 12/2002 | Nakao et al. | |
| 6,642,863 | B1 | * | 11/2003 | Venkitachalam et al. | 341/61 |
| 6,803,869 | B1 | * | 10/2004 | Melanson et al. | 341/143 |
| 2002/0018013 | A1 | * | 2/2002 | Nakao et al. | 341/144 |

* cited by examiner

*Primary Examiner*—Linh V. Nguyen
(74) *Attorney, Agent, or Firm*—Thompson & Knight, LLP; James J. Murphy (57) ABSTRACT

A data converter including a digital volume control for continuously scaling a received stream of digital audio data by a selected factor and a low noise delta-sigma modulator for re-quantizing a scaled digital data stream output from the digital volume control.

35 Claims, 8 Drawing Sheets

CIRCUITS, SYSTEMS AND METHODS FOR VOLUME CONTROL IN LOW NOISE 1-BIT DIGITAL AUDIO SYSTEMS

CROSS REFERENCE TO RELATED APPLICATIONS

This application for patent is a continuation of U.S. patent application Ser. No. 10/269,582, filed on Oct. 11, 2002 is now a U.S. Pat. No. 6,803,869, entitled "Circuits, Systems and Methods for Volume Control in Low Noise 1-Bit Digital Audio Systems," by inventors John Laurence Melanson and Jason Powell Rhode, currently pending; which is a continuation in part of U.S. patent application Ser. No. 09/905,475, filed Jul. 13, 2001 is now abandoned, by inventor John Laurence Melanson, entitled "Circuits, Systems and Methods for Volume Control in 1-Bit Digital Audio Systems" currently pending.

BACKGROUND OF THE INVENTION

1. Field of the Invention

The present invention relates in general to digital signal processing and in particular to circuits systems and methods for volume control in low noise 1-bit digital audio systems.

2. Description of the Related Art

To date, most audio formats have used PCM encoding or an encoding that is subsequently decoded into a PCM format. As an example, a compact disk is recorded with a 16-bit format, and at a 44100 Hz sample rate. Newer audio formats use up to 24 bits, and up to 192 kHz sample rates. The Digital to Analog Converter (DAC) subsystem receives PCM data and passes those data through an interpolation filter to increase the sample rate. A delta-sigma modulator then reduces the number of bits representing each sample, for example from 24-bit samples to 1-bit samples (in a single bit modulator) or to 4-bit samples (in a multi-bit modulator). Modulator performance is typically specified in terms of its Modulation Index or MI, which is the ratio of the maximum allowable signal peak modulator input to the mathematical maximal modulator input (equivalent to the signal peak of the feedback signal). For example, if the MI is 0.5 and the modulator has a single-bit bipolar output range, the maximum allowable input produces an output that is 75%+1 and 25%−1 for an average of 0.5. The delta-sigma modulator creates significant quantization noise; however, the delta-sigma modulator has the ability to shift this self-generated noise out of the signal band.

One advantage of multi-bit systems is that a higher modulation index can be used, meaning that the output signals can be of a greater level. The greater signal level directly improves the signal to noise level. If a multi bit modulator is used, the 4-bit data from the delta-sigma modulator is next thermometer encoded to represent 16 levels. The thermometer encoded data is passed through dynamic element matching logic implementing an algorithm for shaping the noise to account for digital to analog converter (DAC) element mismatch. The DAC, which ultimately converts the digital data to analog for eventual presentation to the listener as audio, is often a switched-capacitor circuit that also provides filtering, although continuous time circuits can also be used.

The newer Sony/Philips 1-bit recording system ("Super Audio CD" or "SADC") stores data from an analog modulator onto the given digital storage media in a 1-bit format. As a result, techniques for converting data in the 1-bit digital format to analog must be developed. This is a non-trivial problem since such factors are filtering out of band noise, gain control through the modulator, and hardware minimization must be considered. Moreover, it is usually a requirement that a dynamic range of −120 dB in the audio band be achieved.

An additional consideration in 1-bit audio systems is volume control. Current 1-bit audio systems perform volume control operations in the analog domain, typically after the D/A conversion process. Analog volume controls are inherently undesirable because of additional power consumption, linearity issues, and the potential for added noise. Moreover, it is possible to convert the 1-bit data back into PCM data and then applying normal digital gain techniques. In this case, however, a decimation operation introducing a low pass function would be required which would add time effects that 1-bit encoding was designed to eliminate.

Digital gain scaling on a transient basis is disclosed in Noguchi et al., U.S. Pat. No. 6,604,700. Specifically, Noguchi et al. use gain scaling during a change between digital audio bitstreams to reduce clicks and pops in the ultimate audible output. Noguchi et al., however do not teach applying digital volume controls to a digital audio stream on a continuous basis. Additionally, the system of Noguchi et al has a higher noise floor than is typically desired in newer high performance audio systems.

Given the potential for wide acceptance of the Sony/Philips 1-bit audio format, and the continuous demand for improved sound quality, circuits, systems and methods for volume control in 1-bit digital audio processing systems is required.

SUMMARY OF THE INVENTION

A data converter including a digital volume control for continuously scaling a received stream of digital audio data by a selected factor and a low noise delta-sigma modulator for re-quantizing a scaled digital data stream output from the digital volume control.

The disclosed circuits and systems allow for the elimination of analog amplitude controls, which are undesirable due their increased power consumption, linearity problems, and the potential to add noise to the system. Additionally, the problems of traditional digital gain techniques are avoided, such as the time effects introduced by the decimation operations used in the traditional techniques.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIGS. 1–5 of the drawings, in which like numbers designate like parts.

Figure 1:
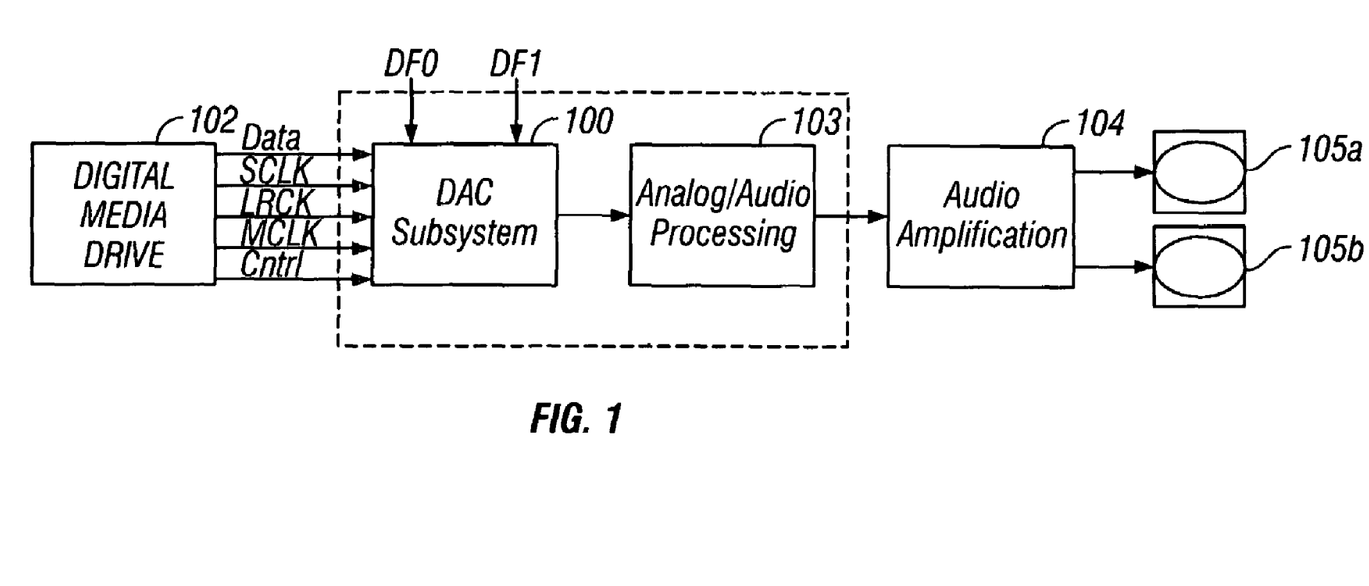
FIG. 1 is a diagram illustrating the major functional blocks of an audio system including digital-to-audio converter (DAC) subsystem embodying the principles of the claimed invention.

FIG. 1 is a diagram of a typical system application of 1-bit analog to digital converter (DAC) 100 according to the principles of the present invention. In this example, DAC subsystem 100 forms part of an audio component 101, such as a compact disk (CD) player, digital audio tape (DAT) player or digital video disk (DVD) unit. A digital media drive 102 recovers the digital data, for example 1-bit audio data in the Sony/Philips 1-bit format from the given digital data storage media, and passes those data, along with clocks and control signals, to DAC subsystem 100. The resulting analog (audio) data undergoes further processing in circuit block 103 prior amplification in amplifier block 104. Amplifier block 104 then drives a set of conventional speakers 105, a headset or the like.

Multi-bit digital audio data is received word-serial through the SDATA pin and serial interface/format selector 101 timed by the sampling clock (SCLK). The left and right channel data are alternately processed in response to the left-right clock (LRCK). This clock is normally at the same rate as the data input rate (i.e., the sampling rate). Control signals DF1 and DF0 allow for the selection of the input format, for example, right or left justified, 20-bit or 24-bit word width, to name a few possibilities. When 1-bit data is being input, the SDATA port receives left channel data and the DF1 port right channel data.

Figure 2A:
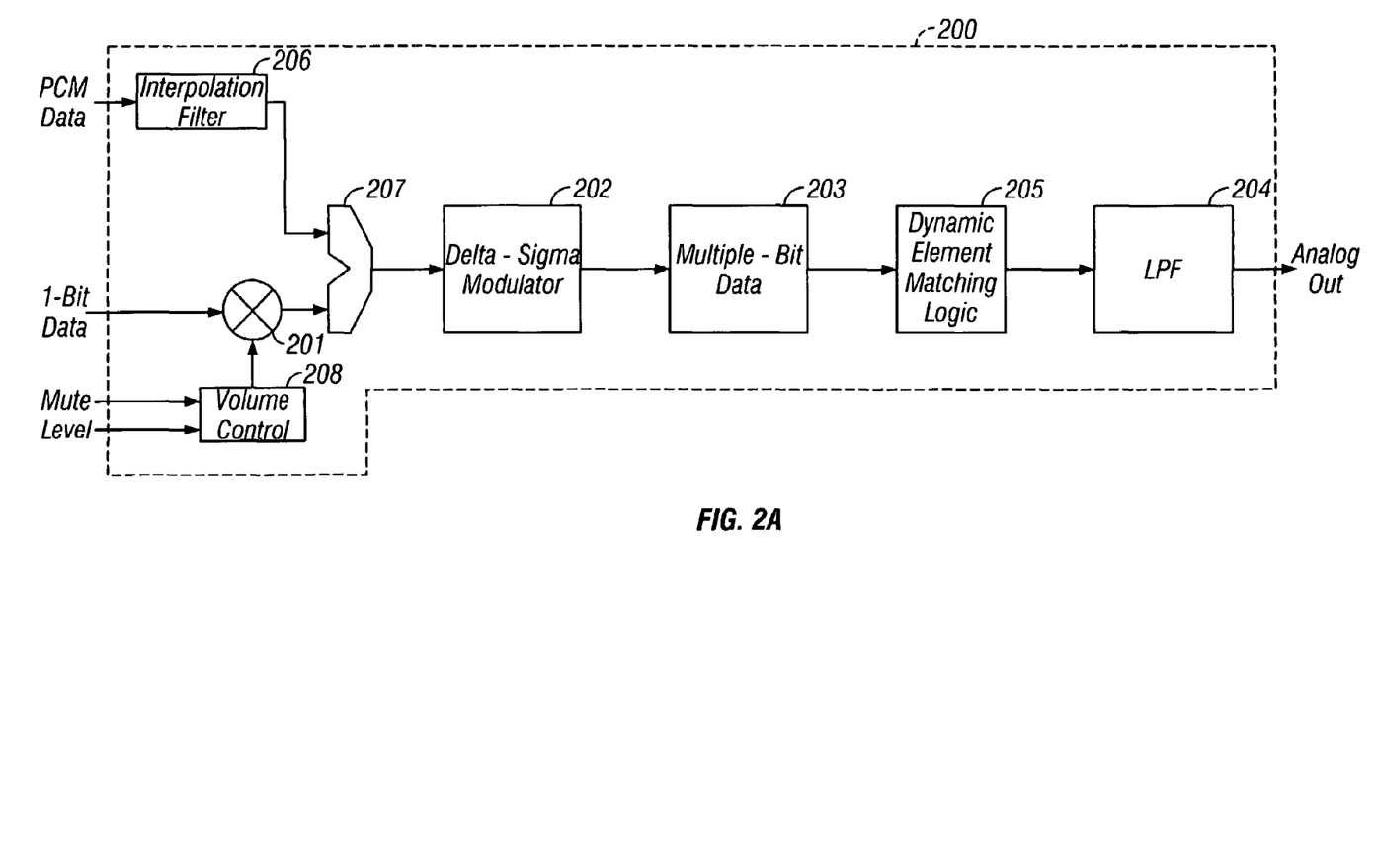
FIG. 2A is a diagram of the functional blocks of one channel of a first DAC circuit suitable for use in the DAC subsystem of FIG. 1.

FIG. 2A is a functional block diagram of one channel of a DAC 200 according to the principles of the present invention and suitable for use in DAC subsystem 100. DAC 200 includes a gain stage (multiplier) 201, Delta-Sigma modulator 202, which re-codes and quantizes the output from multiplier 201, a multiple-bit DAC 203, which converts the multiple-bit data into analog form, and a low pass filter 204. Each of these blocks will be discussed in detail below; however, it is important first to consider the basic inventive concepts behind DAC 200.

One of the significant advantages of multiple-bit DACs is their increased signal-to-noise ratio (SNR) over single-bit DACs. This increase in SNR is primarily due to the higher modulation index (MI) of the multiple-bit circuits. For example, with a 16-level DAC, a MI of over 0.9 is achievable, which results in an SNR improvement of approximately 5 dB relative to a DAC with a MI of 0.5. On the other hand, the typical single-bit DAC has a MI of 0.5, and a correspondingly lower SNR. (It should be noted that the alternative approach of attempting to improve the SNR by decreasing noise in a switched capacitor device, such as a DAC, more than triples capacitor size, which takes up additional chip area and increases device cost). The one-bit data formats, such as SACD, use a MI of 0.5 as the standard.

Another consideration is gain scaling, which differs between multiple-bit and single-bit DACs. Multiple-bit DACs typically provide higher gain over their single-bit counterparts. Since it is desirable in most audio applications to provide the capability to process either multiple-bit or single-bit audio, some accommodation must currently be made at the system level to account for differences in gain scaling to insure consistent volume control. Gain scaling differences can also be a significant disadvantage in applications other than those related to audio as well.

According to the principles of the present invention illustrated in FIG. 2A, the 1-bit data is multiplied by a constant greater than 1 by gain stage (multiplier) 201. Gain stage 201 realizes two primary advantages. First, the increased gain into modulator 202 improves the MI of the following modulator stage. For example, if the gain multiple is in the range of 1.6 to 1.9, the resulting MI is the range of 0.8 to 0.95. Second, the gain stage allows for volume control by processing directly on the 1-bit data. (It should be noted that while gain stage 201 is shown in FIG. 2A as a discrete stage multiplier for convenience, the volume control multiplication could also be performed within the modulator stage itself. A typical modulator is discussed below in conjunction with FIG. 3).

In a single bit data stream, the data is always either a +1 or a −1. Consequently, the multiplication required to implement the volume controls is relatively straightforward. The multiplication factors can be either fractional or integer valued. Notwithstanding, one of the keys to implementing volume controls in this manner is insuring that the data is always kept at a relatively high sample rate relative to signal bandwidth. For example, if the one-bit is sampled at 64 Fs, the conversion after volume scaling may be at 64 Fs or higher, such as 256 Fs.

Volume control inputs to DAC subsystem 200 can be in digital or analog form. Volume control block 208 block converts the input control information into the scaling (multiplication) factors provided to scaling stage 201. Volume control block 208 allows the volume to be ramped up or down, in response to the requisite input, by sending a sequence of scale factors to scaling stage 201. Moreover, a mute function can be implemented where the output is gracefully turned-on or off by the same ramping up and ramping down operations.

Figure 3:
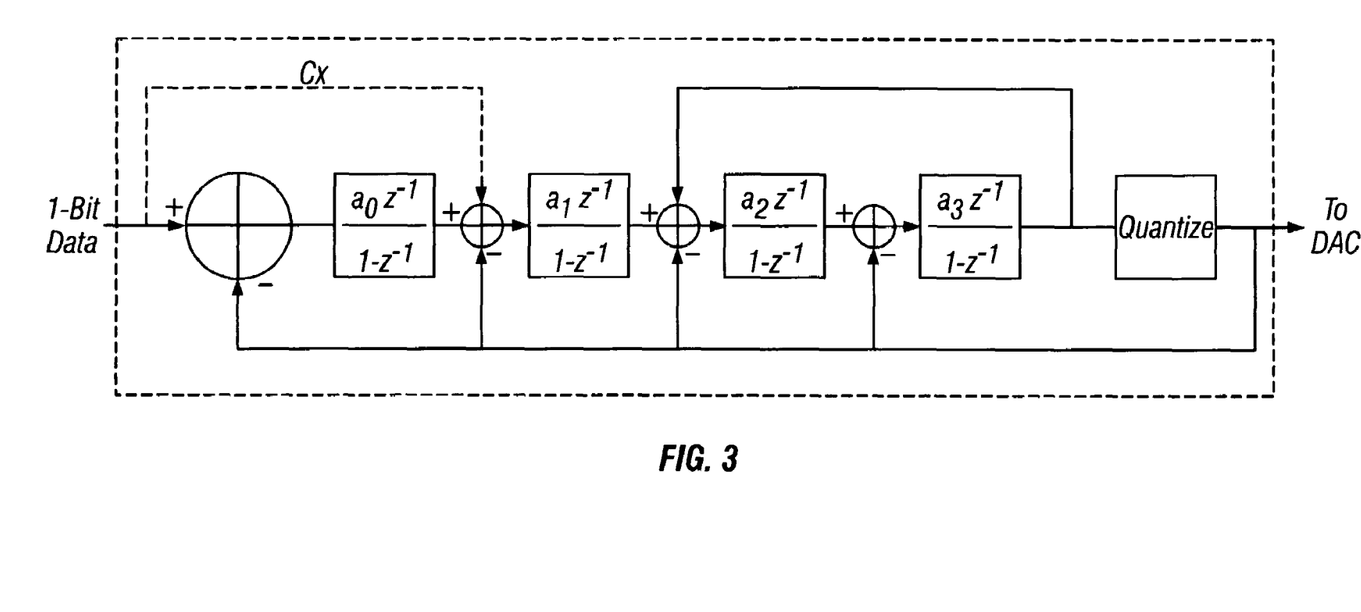
FIG. 3 is a diagram of an exemplary delta-sigma modulator suitable for use in the circuit of FIG. 2A.

One exemplary embodiment of modulator 202 is shown in FIG. 3, which is a fourth order Delta-Sigma modulator including summers 301a–301b, integrator stages 302a–302b and quantizer 303. As indicated below, the volume control multiplication can be performed as part of these operations. (Also note that the principles of the present invention are not limited to 4th order devices.)

Figure 2B:
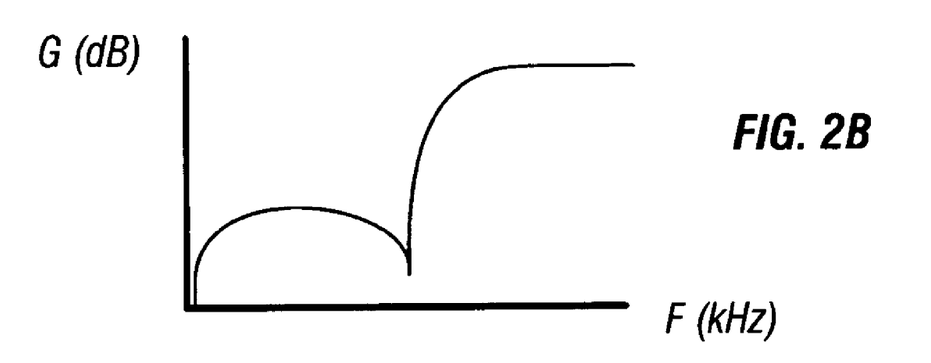
FIG. 2B is a graph illustrating the typical noise transfer function through the ΔΣ modulator of FIG. 2A.

Delta-Sigma modulator 201, whose noise transfer function is generally the high pass response shown in FIG. 2B, re-codes multiple-bit data generated from the volume scaling multiplication into multiple-bit data having m number of levels. For example, the scaled data may be 16 bit and the output of the modulator more completely quantized Delta- Sigma modulated 4-bit data. Modulator 202 also shifts much of the modulation noise from the audio band, generally as shown. The complementary signal transfer function of modulator 201 generally has low pass characteristics, with roll-off above the audio band. This removes much of the modulation noise transmitted with the one bit audio signal.

Frequency response droop can be present in the signal transfer function at the output of LPF 203. Notwithstanding, the present inventive concepts provide for the compensation of this droop by increasing the gain at the passband edge of the modulator. To accomplish this filtering function in the preferred embodiment, the input is fed forward to the second stage 302b through gain $C_x$, or even beyond to the third or fourth stages, to compensate for droop at the higher frequency edge of the passband of filter 203. This option is shown by dashed lines in FIG. 3 at 305.

Figure 2C:
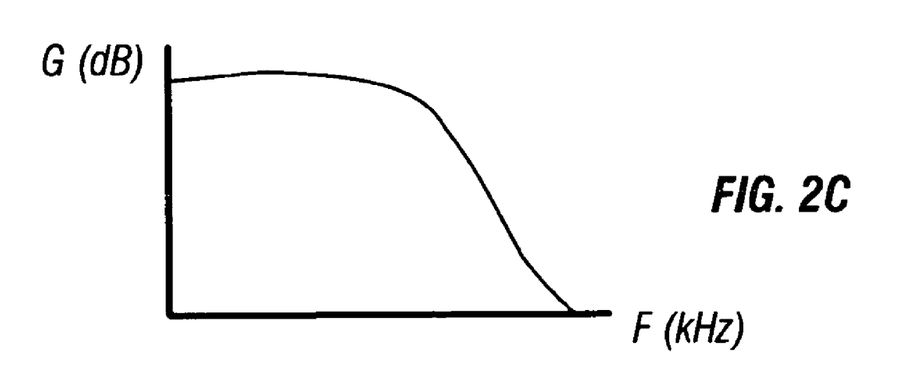
FIG. 2C is a graph illustrating the typical signal transfer function through the low pass filter of FIG. 2A.

The m-level data output from modulator 201 is passed through conventional switched-capacitor multi-bit DAC 202, or other conventional multiple-bit DAC circuit, as selected by multiplexer 207, and converted into the analog domain. Analog low pass filter 203 filters the analog signal with a signal transfer function generally as shown in FIG. 2C. Dynamic element matching (DEM) logic 205 may be provided at the output to multi-bit DAC for shaping noise which may result from DAC element mismatch.

In the preferred embodiment, traditional multiple-bit (PCM) data may also be switched by multiplexer 207 from interpolation filter 206 to delta-sigma modulator 202.

Figure 4:
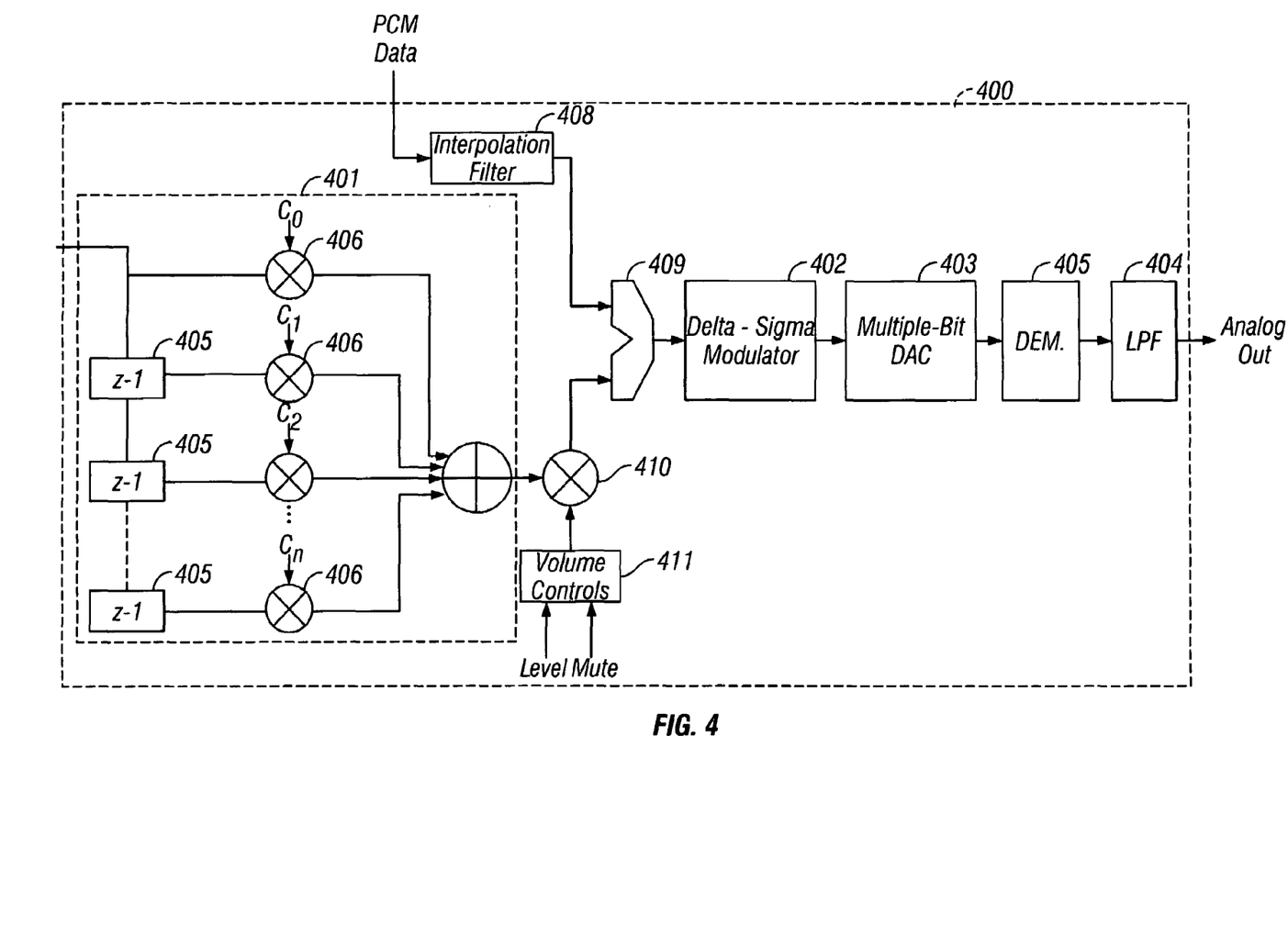
FIG. 4 is a diagram of one channel of a second DAC suitable for use in the DAC subsystem of FIG. 1.

FIG. 4 depicts an alternate 1-bit DAC 400 embodying the inventive concepts. Here, the input 1-bit data is passed through a finite impulse response (FIR) filter 401 and then to be Delta-Sigma modulator 402, multiple bit DAC 403 and low pass filter (LPF) 404. Generally, FIR 401 includes a set of delays 405, preferably one-bit, and a set of multipliers 406 for applying the appropriate weighing coefficients $C_n$. Typically between 4 to 32 such taps are used, which can be implemented with gates and adders.

According to one embodiment, the weighing coefficients $C_O$–$C_n$ can advantageously be used to implement volume control, in addition to the filtering function described below. In this case, if the coefficients are all varied proportionally, the filter gain can be adjusted to vary the output amplitude without substantially changing the filter response.

FIR filter 401 is a low pass filter, which filters the 1-bit data at a high bit rate and removes high frequency out-of-band noise. Preferably, FIR filter 401 has an in-band gain greater than one and runs at least at the rate of multiple-bit DAC 403 and the quantizer of modulator 403, which may be for example 64 fs, where fs is the sampling frequency. It should be noted that the rate data input into FIR 401 is not necessarily the rate at which the filter operates. For example, 64 fs data could be received at the FIR input and then doubled to 128 fs and filtered.

Figure 5A:
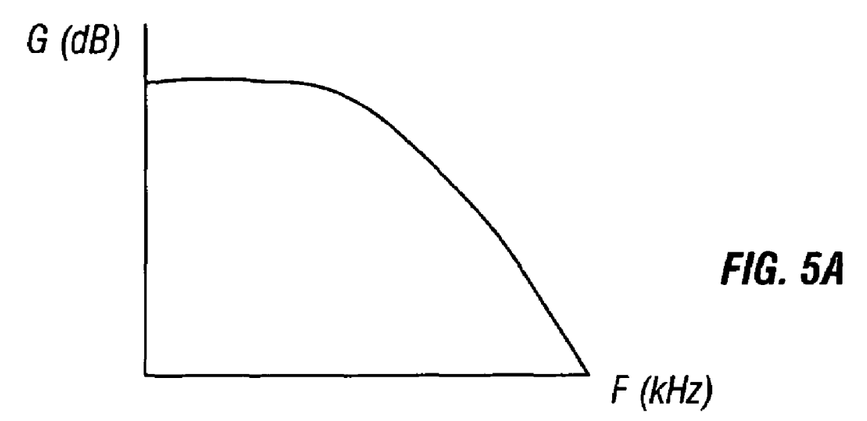
FIG. 5A is a graph depicting a typical signal transfer function through the low pass filter of FIG. 4 without droop compensation.
Figure 5B:
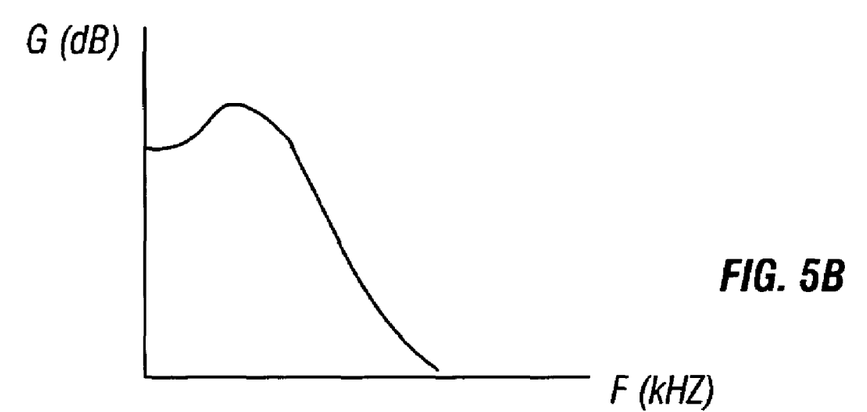
FIG. 5B is a graph depicting a typical signal transfer function through the low pass filter of FIG. 4 with droop compensation.

Advantageously, filter 401 can provide boost at the band edge, as is demonstrated in FIGS. 5A and 5B, which respectively show the output from LPF 404, with and without boosting. Alternately, the above technique of creating boost with feedforward coefficients can be used. In this case, the droop can result both from the FIR filter itself, if identical coefficients are used, or from LPF 404. Identical coefficients, or very simple coefficients, such as ¼, ½, and 1, allow for very simple filter implementation.

According to another embodiment of the inventive principles, a volume scaler is implemented by a 1-bit multiplier 410 and associated control circuitry 411 at the output of filter 401. This embodiment has the advantage of allowing the multiplication to be performed on 1-bit data. Control circuitry 411 is similar to that of block 208, allowing ramping up or down of the output volume, as well as graceful muting. A volume control scaler 410 is provided in the 1-bit data path. Digital and/or analog volume control input data to volume control block 411 controls the ramping and muting of the output signal, similar to that of control block 208 discussed above.

It should be noted that the multiplier stage 410 and volume controls 411 can be placed in front of filter 401. However, in this case, the result of multiplying the 1-bit data by a scaling factor results in multiple bit data being passed to the filter. Consequently, a multiple-bit filter using multiple-bit multiplication operations is required.

It also should be recognized however that another type of low pass filter, such as an infinite impulse response (IIR) filter, with an in-band gain greater than one, can be used in place of FIR filter 401, although at the cost of added complexity.

The output from FIR filter 403 is re-coded into the multiple-bit format by Delta Sigma modulator 402 for conversion by multiple-bit DAC 403.

DAC 403 is also used for converting PCM data received through the multibit PCM path including interpolation filter 408, as switched by multiplexer 409. Preferably, the gain through FIR filter 401 is set to approximate the gain through interpolation filter 408. Again, this feature advantageously allows either a 1-bit or a PCM mode to be selected without significant changes in the analog output signal level.

In this case, is the FIR coefficients selected are simple, the multiplication required for scaling for purpose of volume control can be implemented as a simple shift and add operation with the sign of the addition selected by the data bit.

In either of the example systems discussed above, the multi-bit DAC 202/402 preferably has a noise floor well below that associated with the 1-bit data. Consequently, the re-coding of the 1-bit data to multi-bit data does not significantly impact the total noise floor. Alternatively, dynamic element matching (DEM) logic may be provided at the multi-bit DAC output for implementing noise reduction, as shown n the figures for illustrative purposes.

In sum, the principles of the present invention provide a number of advantages. Among other things, the multi-bit DACs can be used for both single-bit and multi-bit applications without differences in gain scaling. This reduces the required circuitry at the system level normally required to equalize the response between multiple-bit and single-bit processing paths.

Further, the use of a multiple-bit DAC to perform the actual digital to analog conversion takes advantage of the higher modulation indices typically found with multiple-bit DACs vis-a-vis single bit DACs, which in turn leads to improved signal to noise ratios. Additionally, droop at the filter band edges can be substantially reduced or eliminated. In other words, a DAC with one-bit input can be built and operated which has the high MI and constant gain of a multi-bit system.

Figure 6:
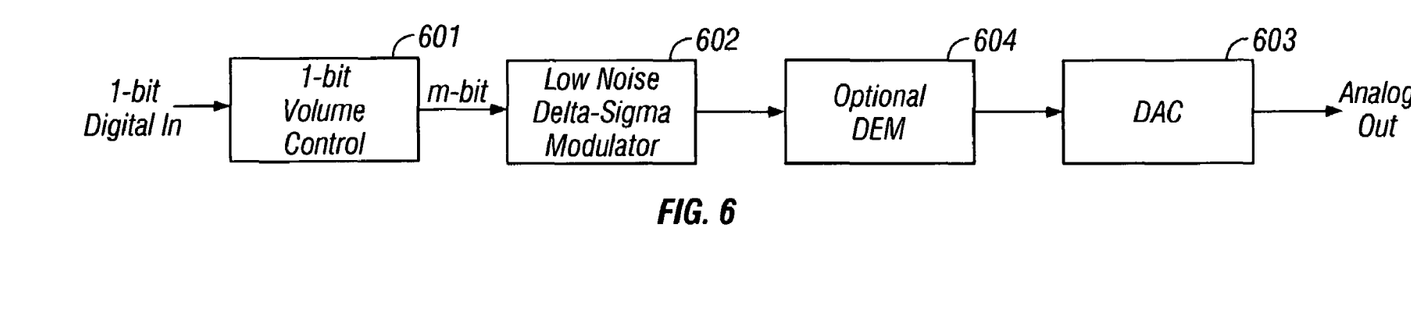
FIG. 6 is a diagram of the operational blocks of a generalized low noise ΔΣ DAC according to the principles of the present invention.

The principles of the present invention can be extended to any low noise delta-sigma modulator based data converter. An exemplary low noise DAC 600 is shown in FIG. 6 for illustrative purposes. Low noise DAC 600 includes a one-bit volume control circuit 601 which scales the incoming one-bit data stream by a given sealing factor to produce m-bit wide samples, as described above. The scaled one-bit data is then re-modulated in a low noise delta sigma modulator 602 which will be discussed in further detail. The modulated output from delta-sigma modulator 602 is then converted to analog form in DAC 603. DAC 603 is, for example, a switched-capacitor or current steering DAC having a number of one-bit conversion elements corresponding to the number of output bits from modulator 602. When the output from delta-sigma modulator 602 is multiple-bit, optional dynamic element matching logic 604 is provided to minimize mismatch noise introduced by any mismatch between the elements of DAC 603.

The low noise response of delta sigma modulator 602 is achieved by utilizing a quantizer with a higher number of bits, increasing the oversampling rate of the data through the modulator, utilizing a more sophisticated or higher order modulator, or a combination of these techniques.

Figure 7A:
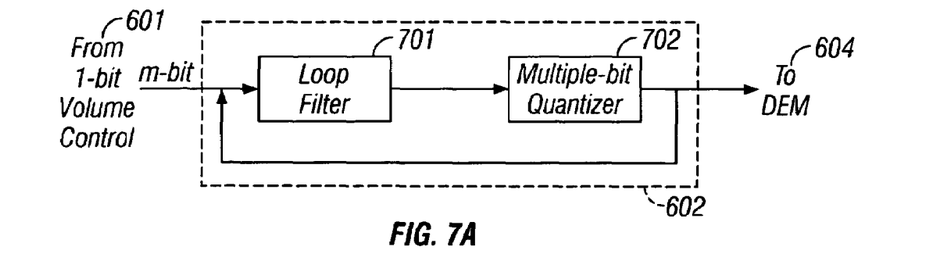
FIG. 7A is a block diagram of an exemplary ΔΣ modulator topology with a multiple-bit quantizer suitable for utilization in the low noise ΔΣ modulator block shown in FIG. 6.

As discussed above, delta-sigma modulators with multiple-bit quantizers have a number of advantages over single-bit modulators, including a higher MI and a corresponding improvement in SNR. Furthermore, by increasing the number of quantization levels, the quantization noise is also proportionally reduced. Specifically, as the number of quantization levels increases, the more bits are available to represent each re-quantized output word thereby decreasing the truncation (quantization) error. One such multiple-bit quantizer topology suitable for utilization as low noise modulator 601 of FIG. 6 is shown in FIG. 7A and includes a loop filter 701 receiving m-bit scaled data from volume control 601 (FIG. 6) and a multiple-bit quantizer 702 driving optional DEM 604 (FIG. 6). In multiple-bit quantizer embodiments, such as that show in FIG. 7A, an increase in the number of quantization levels requires a corresponding increase in the number of DAC elements in DAC 603. In turn, larger or more complex DEM circuitry 604 is typically required to reduce mismatch noise between the increased number DAC elements.

Figure 7B:
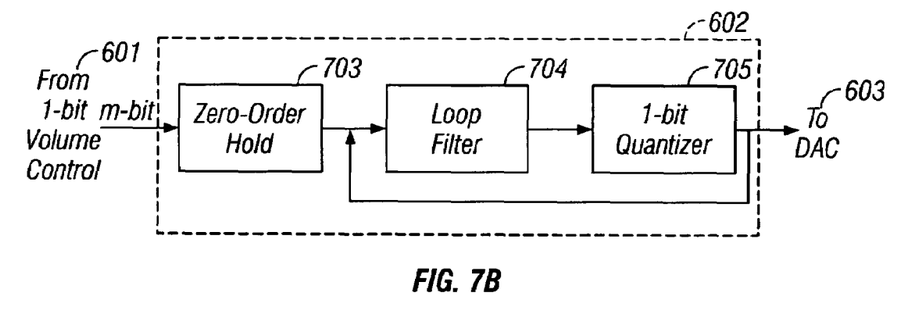
FIG. 7B is a block diagram of an exemplary ΔΣ modulator topology with an increased oversampling rate and a single-bit quantizer suitable for utilization in the low noise ΔΣ modulator block shown in FIG. 6.

Another embodiment of low noise delta-sigma modulator 602 re-quantizes the scaled data at a higher oversampling rate. By increasing the oversampling rate, the quantization noise generated by delta-sigma modulator 604 is shifted to even higher out-of-band frequencies. This embodiment is represented by the exemplary topology shown in FIG. 7B. In this example, the oversampling rate is increased in delta-sigma modulator 602 with a simple circuit, such as zero-order hold 703. In alternate embodiments, an interpolator or a filter, such as a FIR filter, increases the oversampling rate. Increasing the oversampling rate to shift quantization noise to an even higher frequency band is described in co-assigned U.S. Pat. No. 6,255,975 to Swanson for "Circuits and Methods For Noise Filtering in 1-Bit Audio Applications", incorporated herein by reference. In the exemplary topology of FIG. 7B, the unsampled data are passed through a loop filter 704 and a single-bit quantizer 705. When a single-bit quantizer 705 operating at the higher oversampling rate is used to improve noise performance, DEM circuitry 604 advantageously is no longer required.

Figure 7C:
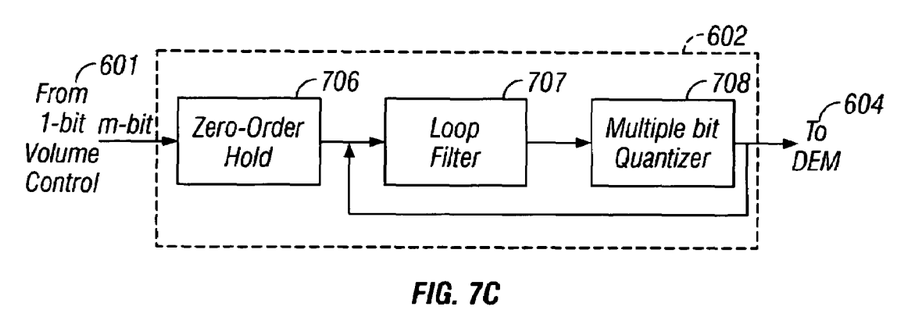
FIG. 7C is a block diagram of an exemplary ΔΣ modulator topology with an increased oversampling rate and a multiple-bit quantizer suitable for utilization in the low noise ΔΣ modulator block shown in FIG. 6.

The technique of increasing sampling rate to shift noise to higher out-of-band frequencies may be used in embodiments of delta-sigma modulator 602 utilizing a multiple-bit output quantizer. An exemplary topology for these embodiments is shown in FIG. 7C which includes a zero-order hold 706 or similar circuit for upsampling the incoming m-bit scaled data, a loop filter 707, and a multiple-bit quantizer 708. While the topology of FIG. 7C takes advantage of both an increased oversampling rate and an increase in quantization levels to reduce in-band noise, the design of DEM 604 and/or DAC 603 becomes more complex.

In alternate embodiments, low noise performance in delta-sigma modulator 602 is achieved by utilizing a more sophisticated topology and/or increasing the modulator order. For example, a cascaded (MASH) modulator design may be selected which significantly increases noise attenuation in the signal passband. Alternatively, a single quantizer (single-loop) topology, for example a feedforward or feedback topology, with a higher order may be chosen. An increase in order increases the number of poles and zeros in the modulator noise transfer function thereby increasing the noise attenuation in the signal passband and the steepness of the signal passband edges. Various cascaded and single-loop modulator topologies known in the art are described in various publications such as Norsworthy, et al., *Detla-Sigma Data Converters, Theory, Design and Simulation*, IEEE Press, 1996.

Although the present invention and its advantages have been described in detail, it should be understood that various changes, substitutions and alterations can be made herein without departing from the spirit and scope of the invention as defined by the appended claims.

What is claimed is:

1. A data converter comprising:
   a user controlled digital volume control for continuously scaling a received stream of single-bit digital audio data by a selected factor, the selected factor selected in response to user provided input information; and
   a low noise delta-sigma modulator for re-quantizing a scaled digital data stream output from the digital volume control.

2. The data converter of claim 1 wherein the low noise delta-sigma modulator comprises a multiple-bit quantizer outputting multiple-bit re-quantized data.

3. The data converter of claim 1 wherein the received steam of digital audio data is at a first oversampling rate and the low noise delta-sigma modulator re-quantizes the scaled digital data stream at a second higher oversampling rate.

4. The data converter of claim 3 wherein the low noise delta-sigma modulator re-quantizes the scaled digital data stream into a single-bit digital stream at the second oversampling rate.

5. The data converter of claim 1 wherein the low noise delta-sigma modulator comprises a high order single-loop modulator.

6. The data converter of claim 1 wherein the low noise delta-sigma modulator comprises a cascaded modulator.

7. The data converter of claim 2 further comprising:
   a multiple element digital to analog converter for converting multiple-bit the re-quantized data into analog form; and
   dynamic element matching logic coupling the low noise modulator and the multiple element digital to analog converter.

8. The data converter of claim 1 wherein the received data stream comprises one-bit digital audio data.

9. The data converter of claim 1, wherein the user controlled digital volume control comprises a volume control circuit for selectively converting input control information into at least one multiplication factor.

10. The data converter of claim 9, wherein the input control information comprises an analog signal.

11. The data converter of claim 9, wherein the input control information comprises digital data.

12. The data converter of claim 9, wherein the multiplication factor is greater than unity.

13. A method of converting a stream of single-bit digital audio data having an input oversampling frequency to analog form comprising:
   selecting a user controlled volume scaling factor in response to user provided input information;

continuously applying the user controlled volume scaling factor to scale the stream of single-bit digital audio data;

re-quantizing the scaled stream of digital audio data with a selected quantization and a selected quantization frequency to generate a re-quantized digital audio stream; and converting the re-quantized digital audio stream to analog form.

14. The method of claim 13 wherein the selected quantization comprises a multiple-bit quantization.

15. The method of claim 13 wherein re-quantizing comprises re-quantization at a selected quantization frequency higher than the input oversampling frequency to shift quantization noise from re-quantization to a higher frequency band.

16. The method of claim 15 wherein the selected quantization comprises a single-bit quantization.

17. The method of claim 14 further comprising performing dynamic element matching prior to converting the re-quantized digital audio stream to analog form.

18. The method of claim 17 wherein re-quantization comprises performing quantization in a low noise delta-sigma modulator.

19. An audio system comprising:
a source of single-bit digital audio data; and
a digital to analog converter for converting the digital audio data into analog for producing audible tones comprising:
 a user controlled digital volume control for continuously scaling the stream of single-bit audio data in response to user provided input information; and
 a low noise delta-sigma modulator for re-quantizing a scaled digital data stream output from the digital volume control.

20. The audio system of claim 19 wherein the low noise delta-sigma modulator performs a multiple-bit re-quantization.

21. The audio system of claim 19 wherein the low noise delta-sigma modulator re-quantizes the scaled data stream output from the digital volume control at an increased oversampling rate to shift quantization noise to a higher frequency band.

22. The audio system of claim 19 wherein the digital audio data comprises single-bit audio data.

23. The audio system of claim 22 wherein the source of digital audio data comprises a super audio compact disk drive.

24. A data converter comprising:
a digital volume control for continuously scaling a received digital audio data steam by a user selected factor from a range of factors including at least one factor greater than unity to create a scaled digital audio data stream output; and
a low noise delta-sigma modulator responsive to the scaled digital audio data stream output from the digital volume control.

25. The data converter of claim 24, wherein the low noise delta-sigma modulator outputs multiple-bit re-quantized data.

26. The data converter of claim 24, wherein the received digital audio data stream is at a first oversampling rate and the low-noise delta-sigma modulator re-quantizes the scaled digital audio data stream at a second higher oversampling rate.

27. The data converter of claim 26, wherein the low noise delta-sigma modulator re-quantizes the scaled digital audio data stream into a single-bit data stream at the second oversampling rate.

28. The data converter of claim 24, further comprising digital to analog [an analog to digital] converter for converting a re-quantized data stream into an analog audio signal.

29. The data converter of claim 25, further comprising:
a multiple element digital to analog converter for converting multiple-bit the re-quantized data into analog form; and
dynamic element matching logic coupling the low noise modulator and the multiple element digital to analog converter.

30. A method of performing volume control in an audio system comprising:
continuously scaling a received digital audio data stream by a user selected factor selected from a set of factors in response to user input information including one factor greater than unity to generate a scaled digital audio data stream output; and
generating a re-qunaitzed digital audio data stream responsive to the scaled digital audio data stream in a low-noise delta-sigma modulator.

31. The method of claim 30, wherein generating a re-quantized digital audio data stream comprises generating a stream of multiple-bit re-quantized digital audio data stream.

32. The method of claim 30, wherein generating a re-quantized digital audio data stream comprises generating a single-bit re-quantized digital audio data stream.

33. The method of claim 30, wherein:
continuously scaling comprises continuously scaling a received digital audio data stream of a first oversampling rate; and
generating a re-quantized digital audio data stream comprises generating a re-quantized digital audio data stream at a second oversampling rate greater than the first oversampling rate.

34. The method of claim 30, further comprising converting the re-quantized digital audio data stream into an analog audio signal.

35. The method of claim 31, further comprising:
performing converter element mismatch shaping on bits of the multiple-bit re-quantized digital audio data stream; and
converting the mismatch shaped bits of the multiple-bit re-quantized digital audio data stream into an analog audio signal.

* * * * *